(12) United States Patent
Linder et al.

(10) Patent No.: US 12,411,337 B2
(45) Date of Patent: Sep. 9, 2025

(54) SYSTEM AND METHOD FOR MEMS DEVICES

(71) Applicant: Texas Instruments Incorporated, Dallas, TX (US)

(72) Inventors: Toby Linder, Dallas, TX (US); John Hamlin, Dallas, TX (US); Kelly J. Taylor, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 656 days.

(21) Appl. No.: 17/681,151

(22) Filed: Feb. 25, 2022

(65) Prior Publication Data

US 2023/0273423 A1    Aug. 31, 2023

(51) Int. Cl.
*G02B 26/08*    (2006.01)
*B81B 3/00*    (2006.01)
*B81C 1/00*    (2006.01)

(52) U.S. Cl.
CPC ........ *G02B 26/0833* (2013.01); *B81B 3/0072* (2013.01); *B81C 1/00666* (2013.01); *B81B 2201/042* (2013.01)

(58) Field of Classification Search
None
See application file for complete search history.

(56) References Cited

U.S. PATENT DOCUMENTS

2021/0111537 A1*    4/2021    Hall .................. G02B 5/08

* cited by examiner

*Primary Examiner* — Anthony Ho
(74) *Attorney, Agent, or Firm* — Michael T. Gabrik; Frank D. Cimino

(57) ABSTRACT

Systems and methods for MEMS devices are disclosed. A microelectromechanical system (MEMS) device includes a substrate, and a MEMS structure supported by the substrate. The MEMS structure includes a first layer of a first material comprising a titanium aluminum alloy. The MEMS structure further includes an aluminum layer on the first layer.

20 Claims, 13 Drawing Sheets

SYSTEM AND METHOD FOR MEMS DEVICES

FIELD OF THE DISCLOSURE

This disclosure relates generally to microelectromechanical systems (MEMS) and, more particularly, to system and method for MEMS devices.

BACKGROUND

Microelectromechanical systems (MEMS) include microscopic devices that often include moving parts controlled through electrical signals. A digital micromirror device (DMD) is a particular example of a MEMS device that includes an array of micromirror assemblies that each include a mirror that can be rotated to direct the reflection of light on the mirror surface. An array of such micromirror assemblies may be fabricated on a single chip for implementation in a projector with each micromirror assembly controlling a separate pixel of a projected image.

Figure 1:
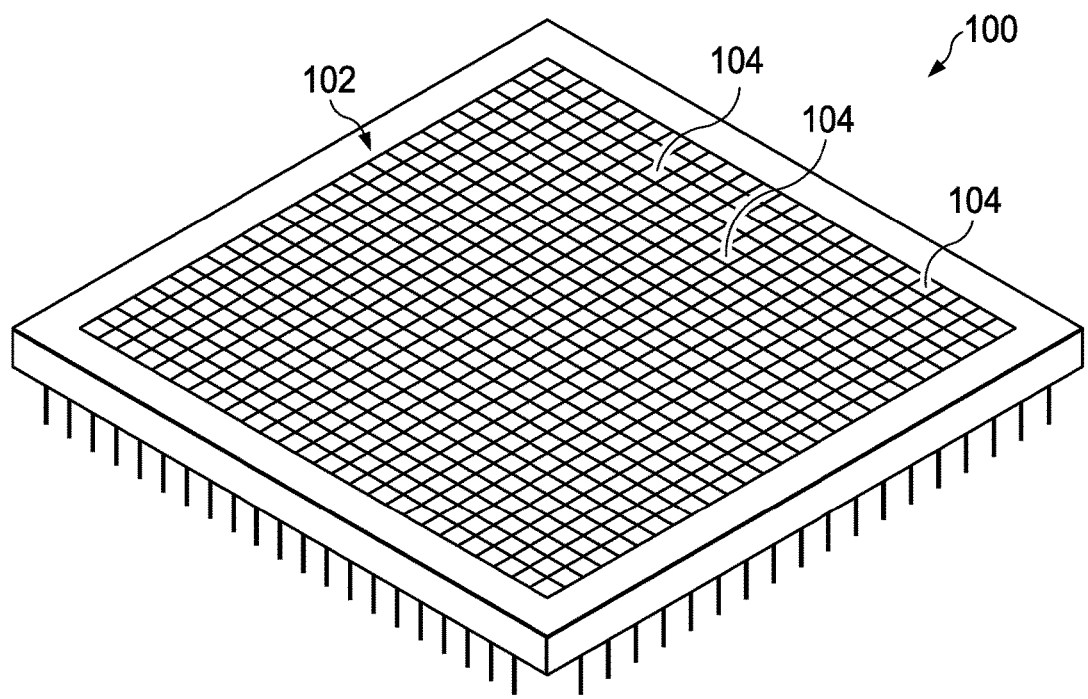
FIG. 1 illustrates an example DMD chip constructed in accordance with teachings disclosed herein.

In general, the same reference numbers will be used throughout the drawing(s) and accompanying written description to refer to the same or like parts. The figures are not necessarily to scale. Instead, the thickness of the layers and/or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time+/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

DETAILED DESCRIPTION

The fabrication processes involved during the manufacture of microelectromechanical system (MEMS) devices can produce stress gradients in components of such devices that can affect the final released shape of the components (e.g., the final shape after all processing and removal of surrounding sacrificial materials). For example, the stress gradient in a micromirror of a digital micromirror device (DMD) can cause the surface of the mirror to deflect or curve, thereby resulting in a non-planar surface. Deflections in the surface of a micromirror are generally undesirable because they reduce the efficiency with which the mirror is able to reflect light in a controlled manner (e.g., they can reduce contrast and tilt angle control).

The stress gradient and, by extension, the resulting shape of a component of a MEMS device is dependent on the materials used for the component and the deposition process (es) used to deposit the materials when fabricating the component. In many situations, particular materials for a component are needed to enable the component to function properly and/or to facilitate the fabrications processes involved such that using a different material is not a viable option to control or adjust the stress gradient and resulting shape of the component. Some fabrication processes that have been implemented to affect the stress gradient of micromirrors include an air-break in which a native oxide interlayer or film is allowed to form on a surface of one or more layers within the metal stack of the mirror substrate. While an air-break can be included in the fabrication process to affect the stress gradient, such an operation has a relatively limited impact on the final shape of MEMS components and can have deleterious impacts on the structural integrity of the components. Furthermore, the impact on the final shape of MEMS components cannot be precisely controlled.

Examples disclosed herein enable the relatively precise control of stress gradients in components, structures, and/or elements of MEMS devices to select and/or tune the stress gradients, thereby selecting or tuning the final shapes of the associated components. More particularly, examples disclosed herein employ one or more layers of titanium aluminide ($TiAl_3$) in components that have a base substrate material of aluminum (Al). The number of the titanium aluminide layers, the thickness of the layers, and the placement of the layers can all be used to adjust and control the resulting stress gradient. Furthermore, precise control of the stress gradient is possible because deposition processes can be precisely controlled to place titanium aluminide at specific locations with specific thickness in a relatively consistent manner. Further still, unit processes (e.g., deposition processes) are easily measurable and controllable. Additionally, the capability of in-situ deposition of titanium aluminide results in a reduced (e.g., minimal) impact on the manufacturability of an overall metal stack.

FIG. 1 illustrates an example DMD chip 100 constructed in accordance with teachings disclosed herein. As shown in the illustrated example, the DMD chip 100 includes an array 102 of individual micromirror assemblies 104. Many DMD chips include hundreds of thousands of individual micromirror assemblies 104. However, a fewer number of micromirror assemblies 104 are shown in FIG. 1 for purposes of illustration. Each micromirror assembly 104 includes a micromirror (or simply mirror, for short) that can be rotated about a corresponding hinge via associated control circuitry in the DMD chip 100. Further detail regarding the implementation and construction of each of the micromirror assemblies 104 is provided below in connection with FIG. 2.

Figure 2:
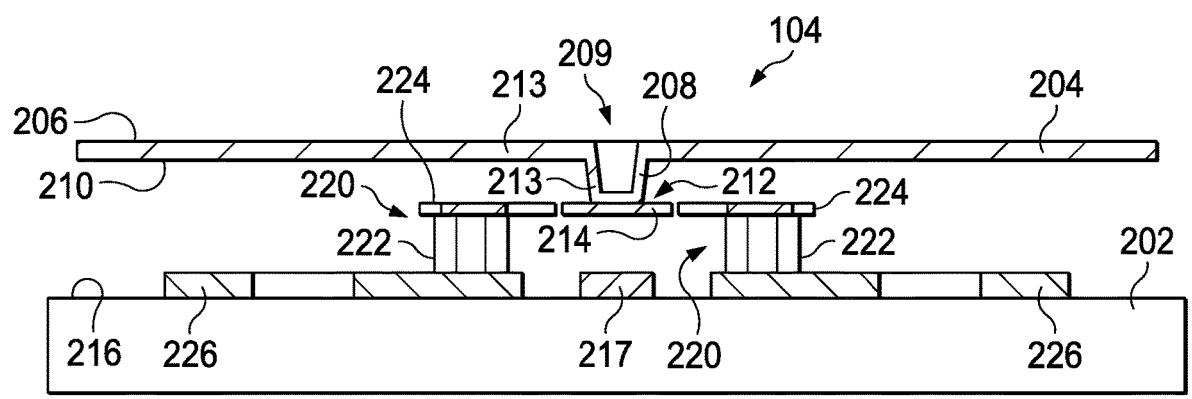
FIG. 2 is a cross-sectional view of an example micromirror assembly of the example DMD chip of FIG. 1 including a metal plate.
Figure 3:
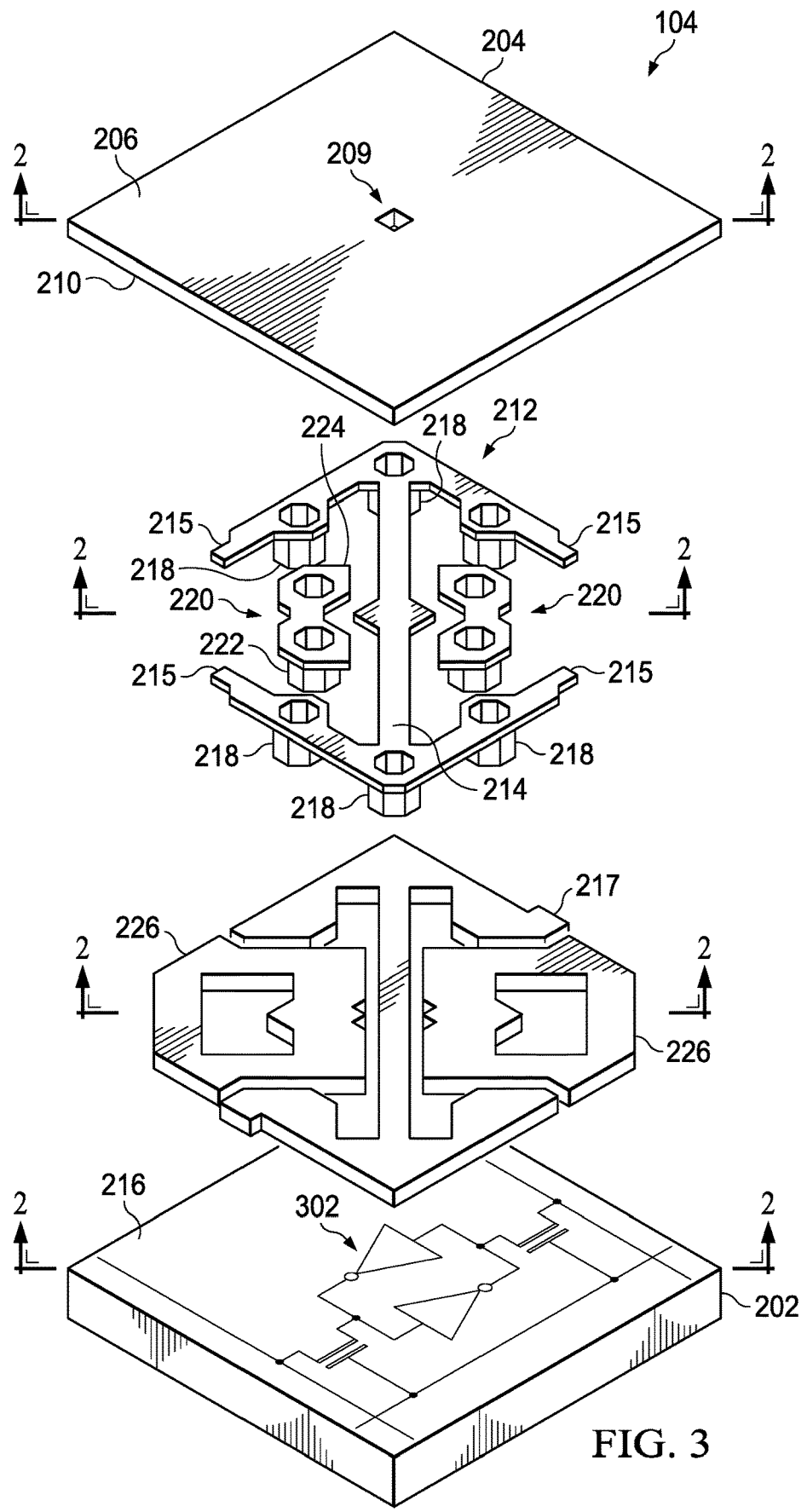
FIG. 3 is an exploded view of the example micromirror assembly of FIG. 2.

FIG. 2 is a cross-sectional view of an example micromirror assembly 104 of the example DMD chip 100 of FIG. 1 taken along the plane defined by the lines 2-2 in FIG. 3, which is an exploded view of the example micromirror assembly of FIG. 2. As shown in the illustrated example, the micromirror assembly 104 is provided on an underlying substrate 202. In some examples, the substrate 202 is a semiconductor (e.g., silicon) substrate. In some examples, all of the micromirror assemblies 104 of the DMD chip 100 of FIG. 1 are fabricated simultaneously on a common substrate (e.g., a single silicon wafer). More particularly, in some examples, multiple DMD chips (each with a corresponding array of micromirror assemblies 104) are fabricated on a common substrate during the same fabrication processes.

As shown in FIGS. 2 and 3, the top of the micromirror assembly 104 (e.g., the point farthest away from the substrate 202) is a plate 204 with an exterior or exposed surface 206 that is reflective to serve as the mirror for the micromirror assembly 104. Accordingly, the plate 204 is alternatively referred to herein as the mirror plate, the micromirror, or simply the mirror of the micromirror assembly 104. In this example, the plate 204 has a generally rectangular or square shape (as shown in FIG. 3) but may be shaped in any other suitable manner (e.g., circular, hexagonal, etc.). In some examples, the plate 204 includes and/or is manufactured from a stack of metal layers. In some examples, a base or primary metal used in the metal stack is aluminum. In some examples, an uppermost layer (e.g., the layer that is exposed at the exterior surface 206) that serves as the reflective surface of the mirror is aluminum. In some examples, the metal stack include one or more layers of titanium aluminide with a thickness selected to adjust or control the stress gradient within the plate 204 and, therefore, the final shape of the plate 204. Further detail regarding different example metal stacks for the plate 204 is provide below in connection with FIGS. 7-11.

In the illustrated example of FIGS. 2 and 3, the plate 204 is suspended in free space with support of a post 208 that protrudes from a back side 210 of the plate 204 (e.g., opposite the exterior or exposed surface 206) near a center of the plate 204. As shown in FIG. 3, the back side 210 is a second exposed surface of the plate 204 that faces in an opposite direction to the exposed surface 206 on the top side of the plate 204. In some examples, the post 208 is coupled to the plate 204 at a location other than the center of the plate 204. In some examples, the plate 204 is supported by more than one post 208. In some examples (as shown), the post 208 is integrally formed with the plate 204. That is, in some examples, the post 208 includes walls defined by metal that protrudes downward from and is a continuous extension of one or more layers in the metal stack of the plate 204. As shown, the formation of the post 208 (not visible in FIG. 3) results in a hole 209 in the exterior surface 206 of the plate 204 that corresponds to the inside of the post 208. In other examples, the hole 209 can be filled with a filler material and/or covered as discussed in more detail below. For purposes of clarity, the plate 204 and the post 208 are collectively referred to herein as a micromirror structure 213 of the micromirror assembly 104.

In this example, the post 208 is coupled to a hinge assembly 212 that includes a hinge 214 and hinge tips 215 formed of a common layer of material. As shown in the illustrated example, the hinge 214 and the hinge tips 215 are supported spaced apart from a top surface 216 of the substrate 202 by plurality of pillars 218. As represented in the illustrated example, the pillars 218 have a hollow interior. In other examples, the pillars 218 may be solid. The hinge 214 is composed of a flexible material to enable the movement of the plate 204 by deflection, twisting, or bending of the hinge 214. More particularly, in the illustrated example, the hinge 214 is to twist or bend so that the plate 204 rotates about an axis extending along a longitudinal length of the hinge 214. In this example, the hinge assembly 212 is supported by a hinge base plate 217 positioned on the underlying substrate 202.

In some examples, movement of the plate 204 is controlled by electrical signals provided to one or more electrodes 220 positioned adjacent the hinge assembly 212. In the illustrated example, the electrodes are defined by pillars 222 and flanges 224 at an upper end of the pillars 222. In some examples, the pillars 222 have a similar height as the pillars 218 such that the flanges 224 are at a same height as the hinge 214 and hinge tips 215. As represented in the illustrated example, the pillars 222 have a hollow interior. In other examples, the pillars 222 may be solid. In this example, separate electrodes 220 are positioned on either side of the hinge 214 and are supported by separate electrode base plates 226 positioned on the underlying substrate 202. Charges applied to the electrodes 220 either attract or repel the plate 204, the post 208, and/or portions of the hinge assembly 212, thereby enabling the plate 204 to rotate or move due to deflection of the hinge 214. In some examples, charges applied to the electrodes 220 are provided through circuitry 302 provided in the substrate 202 (the circuitry 302 is diagrammatically represented on the top surface 216 of the substrate 202 in FIG. 3 for purposes of explanation). The position and size of the electrodes 220 shown in FIG. 2 is for purposes of illustration only.

Figure 4:
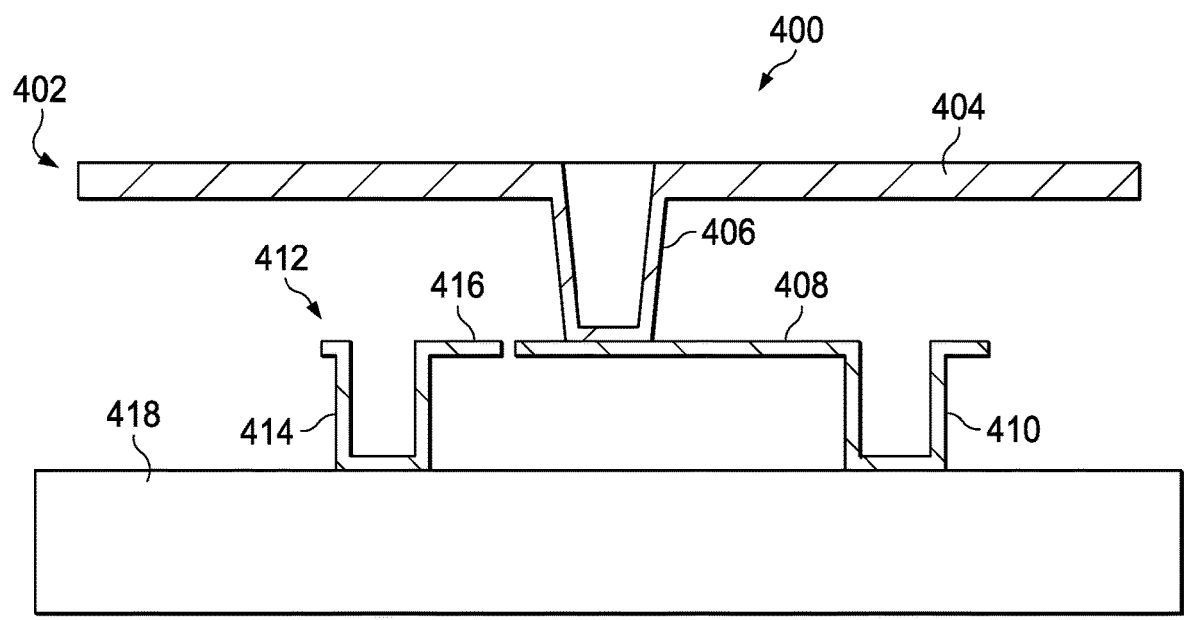
FIG. 4 is a cross-sectional view of another example micromirror assembly.

The particular design of the example micromirror assembly 104 shown in FIGS. 2 and 3 is for purposes of illustration only and many other designs are possible. For instance, FIG. 4 illustrates a cross-sectional view of another example micromirror assembly 400 in which a micromirror structure 402 (including a plate 404 and a post 406) is supported near an end of a cantilevered hinge 408 supported by a pillar 410. In such examples, unlike the hinge 214 of FIGS. 2 and 4 that twists between two pillars 218 at opposite ends of the hinge 214, the hinge 408 of FIG. 4 deflects up and down at its free end (farthest from the pillar 410) to cause the plate 404 to rotate about an axis proximate the pillar and extending into and out of the view shown in FIG. 4. In this example, an electrode 412 is positioned adjacent the free end of the hinge 408. The electrode 412 includes a pillar 414 that supports a flange 416. In the illustrated example of FIG. 4, the pillar 410 and electrode 412 are mounted on the underlying substrate 418 without an intervening base plate (as in FIGS. 2 and 3).

Figure 5:
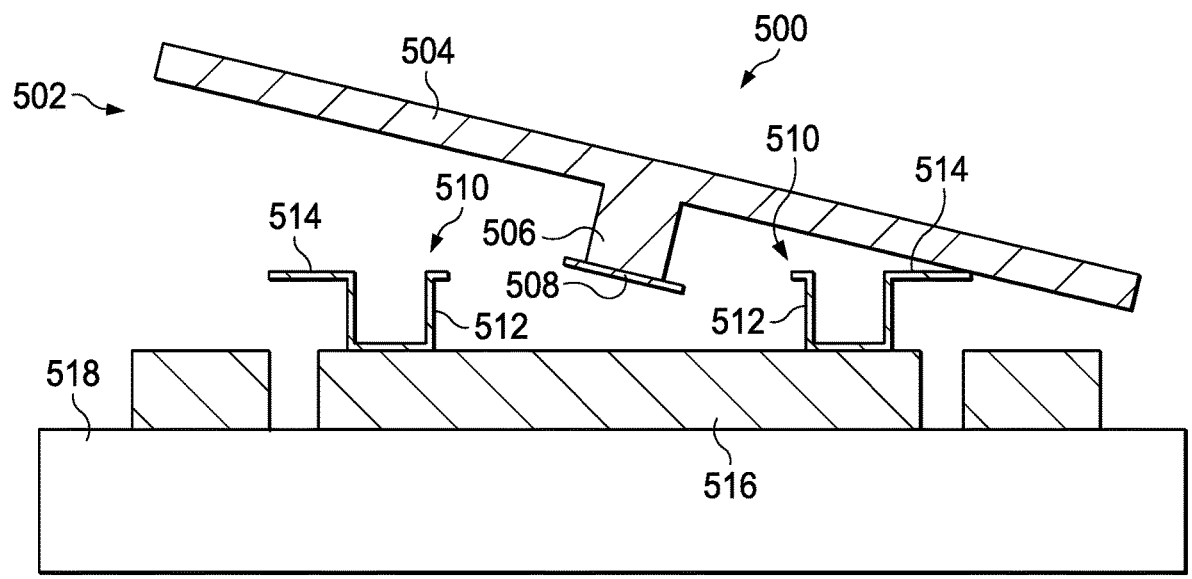
FIG. 5 is a cross-sectional view of another example micromirror assembly.

FIG. 5 illustrates a cross-sectional view of another example micromirror assembly 500 in which a micromirror structure 502 (including a plate 504 and a post 506) is positioned on a hinge 508 that extends into and out of the drawing between separate pillar (not shown) in a manner similar to that shown in FIG. 3. In the illustrated example of FIG. 5, the hinge 508 is shown deflected to one side resulting in the plate 504 tilting or rotating accordingly. Similar to FIGS. 2 and 3, the micromirror assembly 500 of FIG. 5 includes electrodes 510 (defined by pillars 512 and corresponding flanges 514) positioned on either side of the hinge 508. However, unlike the example shown in FIGS. 2 and 3, the electrodes 510 in FIG. 5 are spaced farther away from hinge 508 with a longer protruding portion of the flanges 514 on the side of the electrodes 510 opposite the hinge 508. In some examples, the plate 504 contacts the protruding portion of the flanges 514 (coupled to the pillars 512 of the electrodes 510) when the micromirror 502 is rotated as shown in FIG. 5. Further, the micromirror assembly 500 of FIG. 5 differs from FIGS. 2 and 3 in that both electrodes 510 are supported by a common portion of a base plate 516 (on an underlying substrate 518) rather than separate portions as in FIGS. 2 and 3. More generally speaking, the design, shape, and/or structure of any of the micromirror assemblies 104, 400, 500 of FIGS. 1-5 can be modified in any suitable manner in accordance with teachings disclosed herein. For instance, the hinge can be sized and shaped in any suitable manner and located in any suitable manner to enable adjustments to the orientation of the mirror. In some examples, more than one hinge may be implemented to enable adjustments to the orientation of the mirror in multiple directions. In some such examples, different hinges and associated supporting pillars may be positioned at different levels in an associated hinge assembly (e.g., a first hinge can be supported by a first pillar that is itself mounted to a second hinge supported by a second pillar). Further, the electrodes can be sized and shaped in any suitable manner and located at any suitable position relative to the micromirror structure and supporting hinge assembly.

For purposes of explanation, the illustrated example of FIGS. 2 and 3 will be references with the understanding that the following description can be applied equally to the examples shown in FIGS. 4 and 5 and/or any other suitable micromirror assemblies. In some examples, the exterior surface 206 (e.g., the mirror surface) of the plate 204 is constructed to be a near planar surface to facilitate controlled reflections of light. However, due to limitations in manufacturing processes and resulting stresses created in the plate 204 and other components during such processes, the exterior surface 206 of the plate 204 is unlikely to be perfectly planar. More particularly, the fabrication processes involved in manufacturing the plate 204 supported on the hinge assembly 212 can result in a stress gradient across the plate 204 that can result in the plate 204 deforming. Such deformation is particularly problematic due to the fact that the plate 204 is positioned so as to be suspended in free space (except for the point at which it is coupled to the post 208) such that there are no surrounding structures attached to the plate 204 to reduce its deformation.

The particular way in which the plate 204 deforms can depend upon the materials used in the metal stack of the plate 204, the thickness of the layers of such materials, and the fabrication processes involved in fabricating the plate 204 as well as any fabrication processes implemented after the fabrication of the plate 204. For instance, in some situations, the stress gradient in the plate 204 can cause the plate to curve downward, thereby forming a convex exterior surface 206 as shown in the illustrated example of FIG. 6. In other situations, the stress gradient in the plate 204 can cause the plate to curve upward, thereby forming a concave exterior surface 206 as shown in the illustrated example of FIG. 7.

Figure 6:
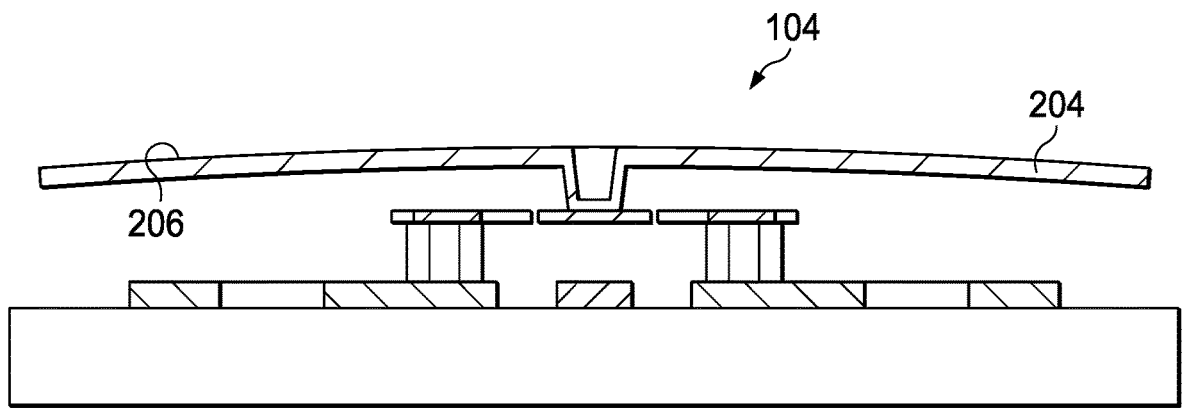
FIG. 6 illustrates the example micromirror assembly of FIG. 2 with the metal plate curved downward.
Figure 7:
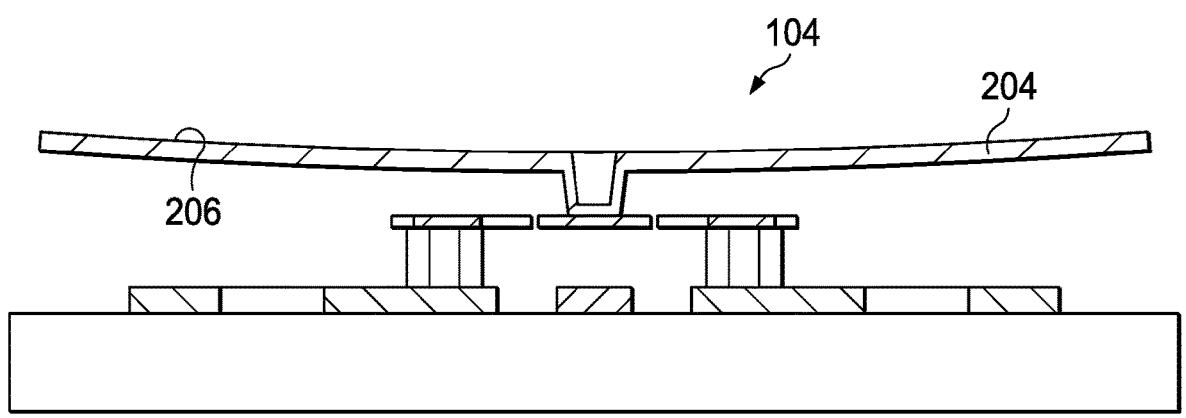
FIG. 7 illustrates the example micromirror assembly of FIG. 2 with the metal plate curved upward.

The amount of deflection of the plate 204 in FIGS. 6 and 7 is exaggerated for purposes of explanation. However, actual measurements of typical micromirrors have that are not constructed in accordance with teachings disclosed herein have shown deflections that vary across the surface of the mirror between approximately +1400 Å near the corners and approximately −900 Å near the center of the plate. Thus, the mirror surface is non-planar with a total amount of deflection or non-planar variability across the surface area of the mirror exceeding 2000 Å. By contrast, actual measurements of experimental micromirrors constructed in accordance with teachings disclosed herein have shown significantly smaller amounts of deflection across the surface area of the mirror. More particularly, in some examples, the amount of deflection or non-planar variable across example micromirrors disclosed herein is approximately 150 Å. As such, examples disclosed herein provide mirror surfaces that are much less warped and significantly more planar than is possible using existing fabrication techniques.

The improved planarity of the mirror surface in disclosed examples is accomplished by using one or more layers of metal that are composed of an alloy containing both titanium and aluminum (e.g., titanium aluminide (TiAl$_3$)) adjacent one or more layers of metal that are composed of substantially pure aluminum. As used herein, "substantially pure aluminum" is expressly defined to mean at least 95 atomic percentage (at %) of the material is pure aluminum. As used herein, an "aluminum layer" is similarly defined to mean a layer that contains at least 95 at % of pure aluminum. By contrast, as used herein, a "titanium aluminum alloy" is expressly defined to refer to a material in which there is a significant amount (e.g., more than trace amounts) of each of titanium and aluminum. As used herein, "a significant amount" is expressly defined to mean more than 5 at % of a particular material (e.g., titanium or aluminum) is included in the alloy. Thus, as used herein, "titanium aluminum alloy" means an alloy that includes more than 5 at % of titanium and more than 5 at % of aluminum. More particularly, in some examples, the titanium aluminum alloy corresponds to titanium aluminide (TiAl$_3$) with the proportion of titanium in the titanium aluminide ranging from 23 at % to 52 at %. In view of the above definitions, it should be noted that, in some examples, the substantially pure aluminum may include some titanium but in quantities that are less than a significant amount as defined above. For instance, in some examples, the "substantially pure aluminum" (or "aluminum layer") contains less than 0.5 at % titanium or less (e.g., 0.2 at %). FIGS. 8-12 illustrate different example micromirror structures 800, 900, 1000, 1100, 1200 that may be constructed to implement any one of the micromirror structures 213, 402, 502 of FIGS. 2-5. As shown in the illustrated examples, the micromirror structures 800, 900, 1000, 1100, 1200 are composed of a metal stack that includes multiples layers of different metal materials stacked on one another in a direction normal to the exterior planar surface (e.g., the exterior surface 206) of the metal plates associated with the micromirror structures 800, 900, 1000, 1100, 1200. More particularly, in the illustrated examples, the different layers are stacked parallel to one another and parallel to the exterior surface. In the illustrated examples, there is at least two layers of material that include substantially pure aluminum without a significant amount of titanium and at least one layer of material that includes significant amounts of both titanium and aluminum (e.g., titanium aluminide (TiAl$_3$)). Further, as shown in the illustrated example, at least some of the layers of metal in the metal stack that is used to form the plate or micromirror also extends down into and forms the walls of the post that is used to couple the micromirror structure 800, 900, 1000, 1100, 1200 to a hinge (e.g., any one of the hinges 214, 408, 508). That is, in some examples, the post is integrally formed with the plate.

Figure 8:
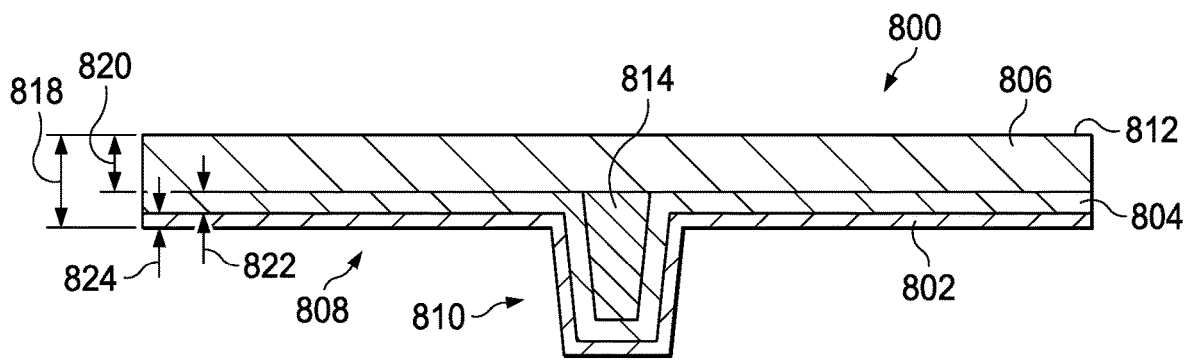
FIGS. 8-12 illustrate different example micromirror structures that may be constructed to implement the micromirror structures in any one of FIGS. 2-5.

Turning in detail to the illustrated examples, the micromirror structure 800 of FIG. 8 includes three layers 802, 804, 806 of material that define the micromirror or plate 808 and also define the post 810. In this example, the layer 802 is composed of titanium aluminide (e.g., it includes significant amounts of both titanium and aluminum) whereas the layers 804, 806 are composed of substantially pure aluminum (e.g., the layers 804, 806 do not include a significant amount of titanium). Thus, in this example, there is not a significant amount of titanium between the layers 804, 806. In this example, there is a single layer of material that includes a significant amount of titanium that is farthest from the exterior surface 812 and closest to the underlying substrate (e.g., the substrate 202 shown in FIG. 2). As shown in FIG. 8, the material of both the layers 802, 804 extend along and define the walls of the post 810. In some examples, the thicknesses of the layers 802, 804 are insufficient to fill the entire cross-section of the post 810. Accordingly, in some examples, a filler material 814 is deposited in a cavity within the post 810 beneath the layer 816 to fill the gap between the layers 802, 804. The filler material 814 can be any suitable material (e.g., a photoresist, an organic bottom antireflective coating (BARC), etc.). The layer 806 extends across the cavity within the post 810 to cover the entire surface of the plate. More particularly, in this example, the layer 806 defines the exposed exterior surface 812 that serves as the mirror surface to reflect light.

In some examples, the plate 808 has a total thickness 818 in the range of approximately 1200 Å to approximately 4000 Å. Different thickness can be used for different ones of the layers 802, 804, 806 in different designs of the plate 808 to achieve different stress gradients within the plate 808. Thus, the stress gradient can be controlled or tuned in a precise manner by controller the thicknesses of the each of the layers 802, 804, 806. In the illustrated example, the uppermost layer of aluminum that provides the mirror surface (e.g., the layer 806 in FIG. 8) has a thickness 820 that is thicker than the other layers 802, 804 in the metal stack. However, in other examples, the layer 806 has a thickness 820 that is less than or equal to one or both of the other layers 802, 804. In some examples, the layer 806 has a thickness 820 that is between one quarter and one half (e.g., approximately one third) the total thickness 818 of the plate. That is, in some examples, the thickness 820 of the layer 806 ranges from approximately 300 Å to approximately 2000 Å. Further, in the illustrated example, the layer 804 (also composed of aluminum) has a thickness 822 that is thicker than the layer 802 (composed of titanium aluminide). However, in other examples, the layer 804 has a thickness 822 that is less than or equal to the layer 802. More particularly, in some examples, the thickness 822 of the layer 804 ranges from approximately 300 Å to approximately 2000 Å. Particular example thicknesses 822 for the layer 804 are shown and described in connection with FIGS. 13 and 14. In some examples, the layer 802 (composed of titanium aluminide) has a thickness 824 that is equal to or greater than one or both of the other layers 804, 806 (composed of aluminum). In other examples, the thickness 824 of the layer 802 is less than both the other layers 804, 806. More particularly, in some examples, the thickness 824 of the layer 802 ranges from approximately 100 Å to approximately 500 Å. Particular example thicknesses 824 for the layer 802 are shown and described in connection with FIGS. 13 and 14. In some examples, the combined thickness of the layers composed of substantially pure aluminum (e.g., the layers 804, 806 in FIG. 8) is greater than the thickness of the layer composed of an alloy of titanium and aluminum (e.g., titanium aluminide). Thus, in some examples, a majority of the thickness of the plate 808 is composed of substantially pure aluminum.

Figure 9:
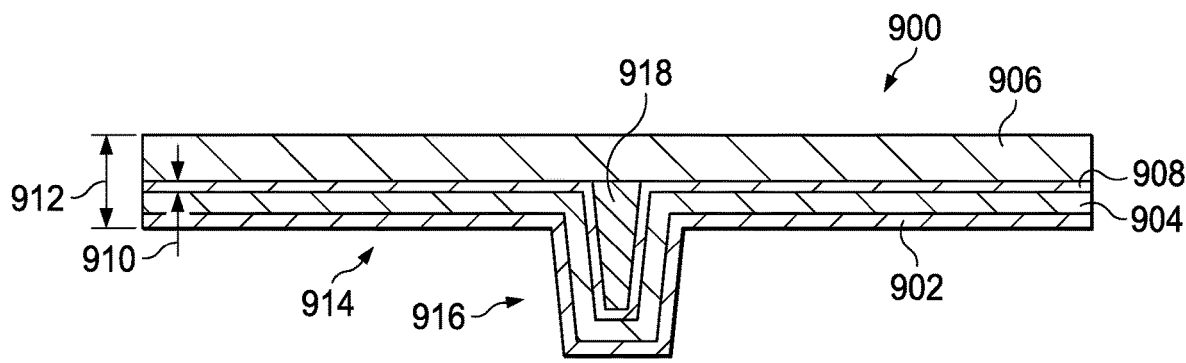

The example micromirror structure 900 shown in FIG. 9 includes two layers of titanium aluminide. More particularly, as shown in FIG. 9, a layer 902 is titanium aluminide. Also, the layer 904 in FIG. 9 is substantially pure aluminum. Further, the uppermost layer 906 in FIG. 9 is substantially pure aluminum. The micromirror structure 900 of FIG. 9 also includes a layer 908 of material positioned between the layers 904, 906. In this example, the material of the layer 908 is the same material as the layer 902. That is, the layer 908 includes titanium aluminide. Thus, in this example, there is a significant amount of titanium positioned between the two layers 904, 906 containing substantially pure aluminum. In some examples, as represented in FIG. 9, the layer 908 (second layer of titanium aluminide) has a thickness 910 that is thinner than the layer 902 (first layer of titanium aluminide). In other examples, the layers 902, 908 have a similar thickness. In other examples, the layer 902 is thinner than the layer 908. More particularly, in some examples, the thickness 910 of the layer 908 ranges from approximately 50 Å to approximately 500 Å (e.g., 100 Å). In some examples, the combined thickness of the layers composed of substantially pure aluminum (e.g., the layers 904, 906) is greater than the combined thickness of the layers composed of titanium and aluminum (e.g., the layers 902, 908). In some examples, the thickness of one or more of the layers 902, 904, 906 in FIG. 9 are adjusted relative to the thicknesses of the corresponding layers 802, 804, 806 in FIG. 8 so that the layer 908 can be included while maintaining the total thickness 912 of the plate 914 in FIG. 9 the same as the total thickness 818 of the plate 808 in FIG. 8. In the illustrated example of FIG. 9, the titanium aluminide extends continuously from the layers 902, 904, 908 along the wall of the post 916 in a similar manner to the layers 802, 804 as described above in connection with FIG. 8. In this example, the post 916 is filled with a filler material 918 in a similar manner to the filler material 814 of FIG. 8. While the micromirror structure 900 of FIG. 9 includes two layers of substantially pure aluminum and two layers of titanium aluminide, in other examples, the metal stack may include additional layers of substantially pure aluminum and/or additional layers of titanium aluminide.

Figure 10:
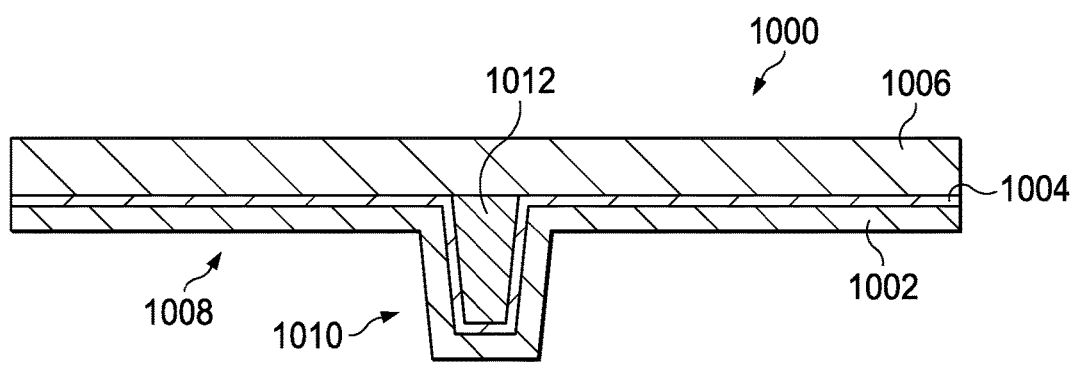

In the example micromirror structure 1000 shown in FIG. 10 a layer 1002 includes substantially pure aluminum, a layer 1004 includes titanium aluminide, and an uppermost layer 1006 includes substantially pure aluminum. Thus, in this examples, the layer 1002 corresponds to the only layer of titanium aluminide in the micromirror structure 1000 and is positioned between the layers 1002, 1006. As described above, each of the layers 1002, 1004, 1006 may have any suitable thickness (such as those described for the corresponding layers in FIGS. 8 and 9) to define a corresponding total thickness for the plate 1008 and the walls of the associated post 1010. In this example, the post 1010 is filled with a filler material 1012 in a similar manner to the filler material 814, 918 of FIGS. 8 and 9.

Figure 11:
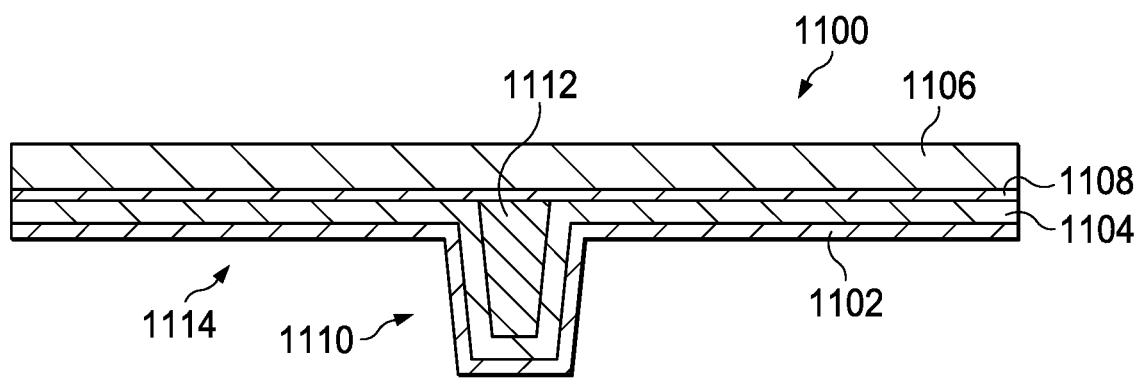

The example micromirror structure 1100 shown in FIG. 11 has a bottommost layer 1102 of titanium aluminide, layers 1104, 1106 of substantially pure aluminum, and a layer 1108 of titanium aluminide between the two layers 1104, 1106 of the aluminum. However, the upper layer of titanium aluminide (e.g., the layer 1108) does not extend along a wall of or into the post 1110. That is, the layer 1108 extends continuously across the plate from one edge to an opposing edge by crossing over the filler material 1112 inside the post 1110. This arrangement is achieved by changing the order of operations implemented to fabricate the micromirror structure 1100 of FIG. 11 relative to the order of operations followed to fabricate the micromirror structure 900 of FIG. 9. More particularly, to fabricate the example micromirror structure 1100 of FIG. 11, the filler material 814 is added before the layer 1108 is deposited. By contrast, to fabricate the example micromirror structure 900 of FIG. 9, the filler material 814 is added after the layer 908 is deposited.

Figure 12:
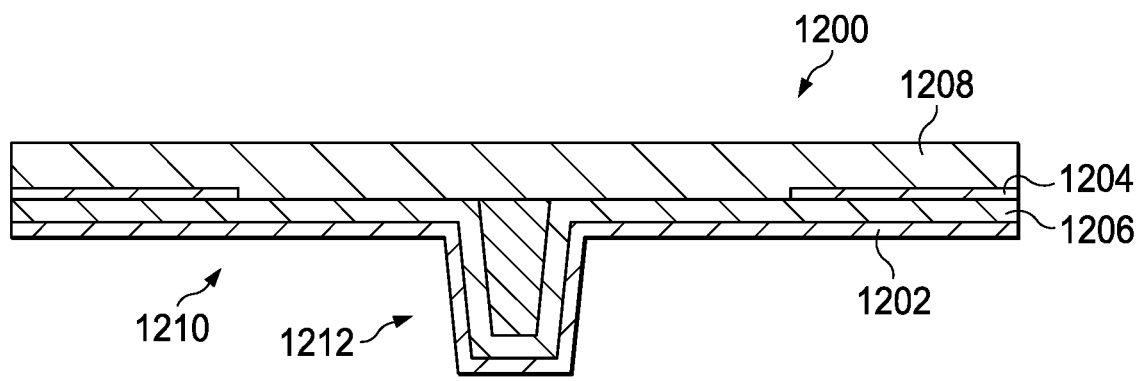

In each of FIGS. 8-11 each of the layers 802, 804, 806, 902, 904, 906, 908, 1002, 1004, 1006, 1102, 1104, 1106 in the metal stack extend substantially across the entire area of the example plates 808, 914, 1008, 1114. However, in some examples, as represented in FIG. 12, at least one of the layers of titanium aluminide is limited to laterally isolated portions of the plane in which the layer is located. More particularly, the micromirror structure 1200 of FIG. 12 includes two layers 1202, 1204 of titanium aluminide and two layers 1206, 1208 of substantially pure aluminum. In this example, the upper layer 1204 of titanium aluminide does not extend a full way across the plate 1210. Stated differently, whereas the aluminum layers 1206, 1208 extend across the entire area of the plate 1114, the layer 1204 of titanium aluminide extends across an area that is smaller than the areas associated with the aluminum layers 1206, 1208. More particularly, in the example shown in FIG. 12, the titanium aluminide in the upper layer 1204 of titanium is located in regions adjacent the outer edges or perimeter of the plate 1210 and spaced apart from the center of the plate 1210 and the post 1212. However, any other suitable placement of the titanium aluminide is possible (e.g., near the center of the plate 1210 and spaced apart from the outer edges of the plate 1210, only at the corners of the plate 1210, etc.). The particular location of the titanium aluminide depends upon the particular structure of the plate 1210, the thicknesses of the layers within the metal stack defining the plate 1210, and the desired stress gradient and corresponding final shape of the plate 1210.

Placing titanium aluminide at particular locations, as represented in FIG. 12, can have particular impacts on the stress gradient in the plate 1210. Thus, by precisely controlling the location of the titanium aluminide, the stress gradient can be precisely controlled, thereby enabling the precise control of the final released shape of the plate 1210. However, depositing titanium aluminide on limited regions rather than the entire surface of the underlying layer in the metal stack creates complexities in the fabrication process. Accordingly, in some examples, the titanium aluminide is deposited in layers that cover all or substantially all of the underlying layers in the metal stack as represented in FIGS. 8-11. In such examples, relatively precise control of the stress gradient is still possible by selecting the number of titanium aluminide layers in the metal stack, the placement of the titanium aluminide layers in the metal stack (e.g., the order in which the layers are deposited to create the stack), and the thicknesses of the titanium aluminide layers (as well as the thickness of the aluminum layers) in the metal stack.

Figure 13:
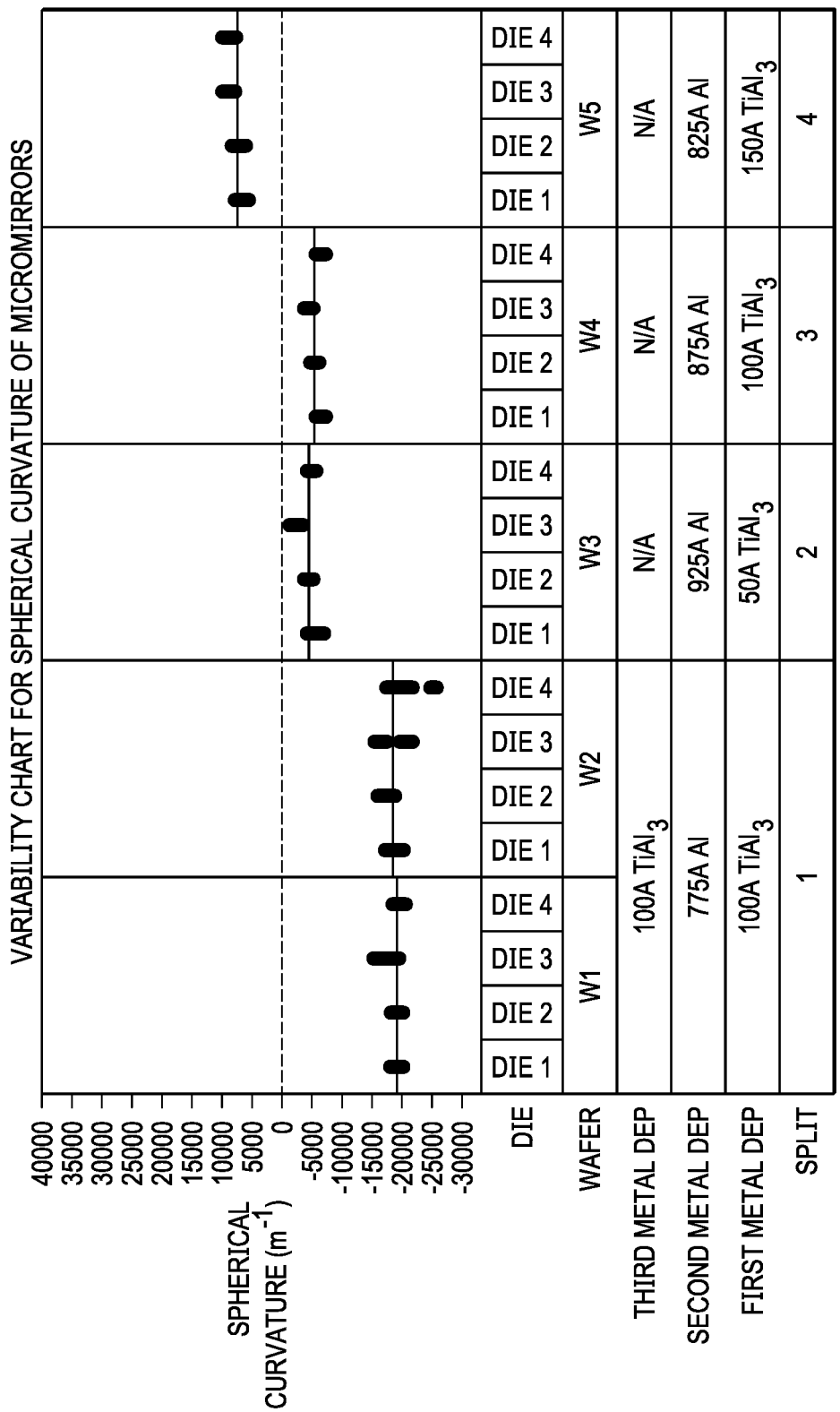
FIGS. 13 and 14 are charts showing measured values of the curvature of metal plates of experimental micromirrors on multiple different dies fabricated on different wafers, where different ones of the wafers are associated with metal plates having different metal stack designs.
Figure 14:
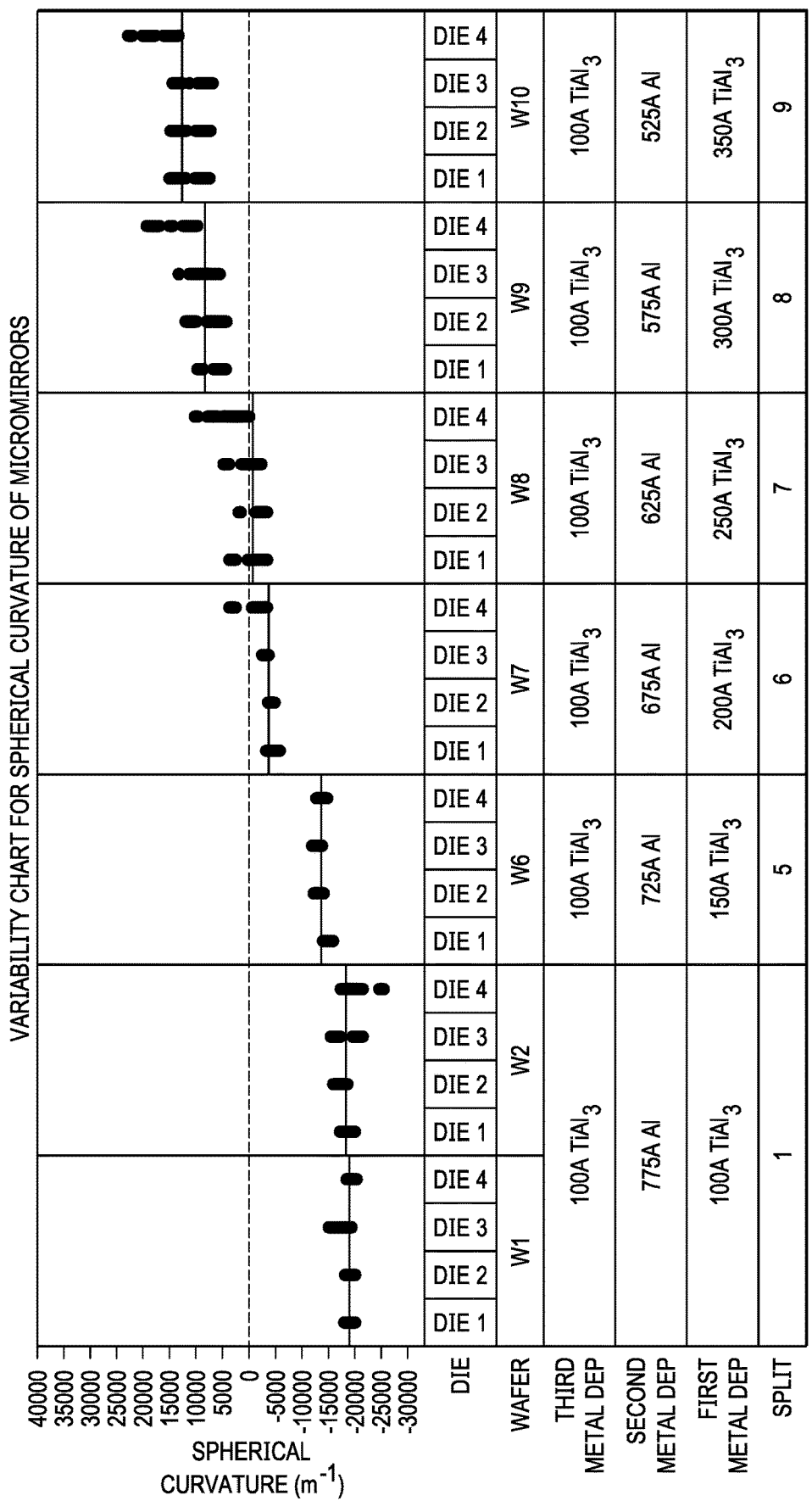

The impact of different thicknesses and placements of the layers has been demonstrated through experimental testing. In particular, FIGS. 13 and 14 are charts showing measured values of the curvature of metal plates of micromirror structures in experimental DMDs on different dies fabricated on different wafers, where different ones of the wafers are associated with metal plates having different metal stack designs. More particularly, the first two wafers (W1, W2) represented on the lefthand side of the charts in both FIGS. 13 and 14 are the same and represent a reference or baseline. As shown in the charts, the first two wafers (W1, W2) include DMDs with metal plates (e.g., micromirror structures) having a first metal layer of titanium aluminide with a thickness of 100 Å, a second metal layer of substantially pure aluminum with a thickness of 775 Å, and a third metal layer of titanium aluminide with a thickness of 100 Å. Thus, the reference metal plates in the experimental testing (associated with the first two wafers W1, W2) correspond to a metal stack similar to what is shown in FIG. 9 with the two layers 902, 908 of titanium aluminide having the same thickness. Such metal plates resulted in a final shape characterized by a negative curvature (e.g., the metal plates were cupped downward with the exterior surface 206 being convex as shown in FIG. 6).

The remaining three wafers identified in FIG. 13 (W3, W4, W5) include DMDs with metal plates in which the third metal layer (corresponding to a second layer of titanium aluminide) is omitted or excluded. That is, the third, fourth, and fifth wafers (W3, W4, W5) correspond to a metal stack similar to what is shown in FIG. 8. Different ones of these experimental DMDs were implemented with different thicknesses for the layer 802 including 50 Å for W3, 100 Å for W4, and 150 Å for W5. In these experimental examples, as the thickness of the layer 802 increased, the thickness of the layer 804 correspondingly decreased (e.g., from 925 Å for W3, to 875 Å for W4, and to 825 Å for W5). Measuring the curvature of the metal plates in these DMDs reveal less curvature than the reference metal plates discussed above. Furthermore, the amount and nature of the curvature depends on the thickness of the layer 802. More particularly, at thicknesses of 50 Å and 100 Å, the curvature remained negative but was closer to 0 (e.g., less curved and/or flatter) than the reference metal plates. In the examples where the thickness of the layer 802 was increased to 150 Å, the measured values for the curvature became positive (e.g., the metal plates were cupped upward with the exterior surface 206 being concave as shown in FIG. 7). Such measurements demonstrate that it is possible to control or adjust the final shape of metal plates by adjusting the thickness of the layer 802 of titanium aluminide.

The five additional wafers identified in FIG. 14 (W6, W7, W8, W9, W10) include DMDs with metal plates in which the third metal layer (corresponding to a second layer of titanium aluminide) is fixed at a thickness of 100 Å, while the first metal layer (also corresponding to titanium aluminide) changes thickness between the different wafers from 150 Å (for W5) to 350 Å (for W10) in 50 Å increments. That is, in the examples, there are two layers of titanium aluminide in a similar manner to that shown in FIG. 9. In these examples, as the thickness of the layer 902 increased, the thickness of the layer 904 (containing substantially pure aluminum) correspondingly decreased (e.g., from 725 Å (for W5) to 525 Å (for W10) in 50 Å increments). Measuring the curvature of the metal plates in each of these DMDs reveal less curvature than the reference metal plates discussed above. Furthermore, as the thickness of the first metal layer (e.g., the layer 902 of FIG. 9) increases, the curvature changes from the most negative curvature (e.g., the plate is cupped downward) for the reference metal plates in which the layer 902 had a thickness of 100 Å) to a most positive curvature (e.g., the plate is cupped upward) for the example metal plates in which the layer 902 had a thickness of 350 Å) with the curvature being closest to 0 (e.g., closest to a flat plane) when the layer 902 had a thickness of 250 Å. As a result of the differences in curvatures based on the differences in thicknesses of the layer 902, it is possible to select a suitable thickness that can achieve planar or substantially planar surface (or any other suitable shape or curvature) for the metal plates.

Significantly, the changes in the measured values of curvature of the fifth through tenth wafers (W6, W7, W8, W9, W10) are incremental in a similar manner to the incremental changes to the thicknesses of the layer 902 of titanium aluminide. In other words, the relationship between changes to the thickness of the titanium aluminide and the resulting curvature of the metal plate is generally linear. As a result, it is possible to precisely tune or control the resulting shape or curvature of a metal plate by selecting the particular thickness corresponding to the desired shape. As discussed above, for micromirrors, it is generally desirable to have the curvature be as close to 0 as possible to provide a substantially planar mirror surface. Thus, in this example, the thickness of 250 Å associated with the eighth wafer (W8) in FIG. 14 is a good selection as the resulting curvature is close to 0. However, in other circumstances, for different MEMS devices and/or micromirrors manufactured using different parameters for the fabrication processes, a different thickness for the titanium aluminide may be more suitable. Furthermore, in some examples, a planar surface may not be needed and/or desired. For instance, a mirror surface of a micromirror that is slightly concave may be desirable to reduce the shorting margin and hinge memory lifetime, thereby providing higher yields and/or improved reliability. The generally linear relationship between titanium aluminide thickness and curvature shown in FIG. 14 establishes that any other suitable shape or curvature can be achieved with a relatively high degree of precision inasmuch as thicknesses of layers can be precisely controlled through deposition processes used to create the layers.

Furthermore, because the curvature can be precisely controlled merely by adjusting the thickness of the titanium aluminide, there is no longer a need to include an air-break in the fabrication process that adds a native oxide film to the metal layers in the metal stack of the metal plate that extend into and form the post 208. Notably, subsequent processing of the post 208 (e.g., adding the filler material 814) will involve exposing the most recently deposited layer of material immediately beneath the filler material 814 to air such that there is likely to be an oxide layer that forms on that layer. However, in some examples, the metal stack in the micromirror structures 800, 900, 1000, 1100, 1200 disclosed herein, does not include an oxide interlayer or film between layers of metal that extend into and/or define the wall of the post 208. Eliminating oxide interlayers within the stack in this matter serves to reduce (e.g., avoid) defectivity concerns that can arise from the presence of such oxide interlayers.

The foregoing examples of the micromirror structures 800, 900, 1000, 1100, 1200 of FIGS. 8-12 and the various thicknesses of metal layers set forth in the experimental testing discussed above in connection with the charts in FIGS. 13 and 14 teach or suggest different features. Although each of the example micromirror structures 800, 900, 1000, 1100, 1200 of FIGS. 8-12 disclosed above have certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Figure 15:
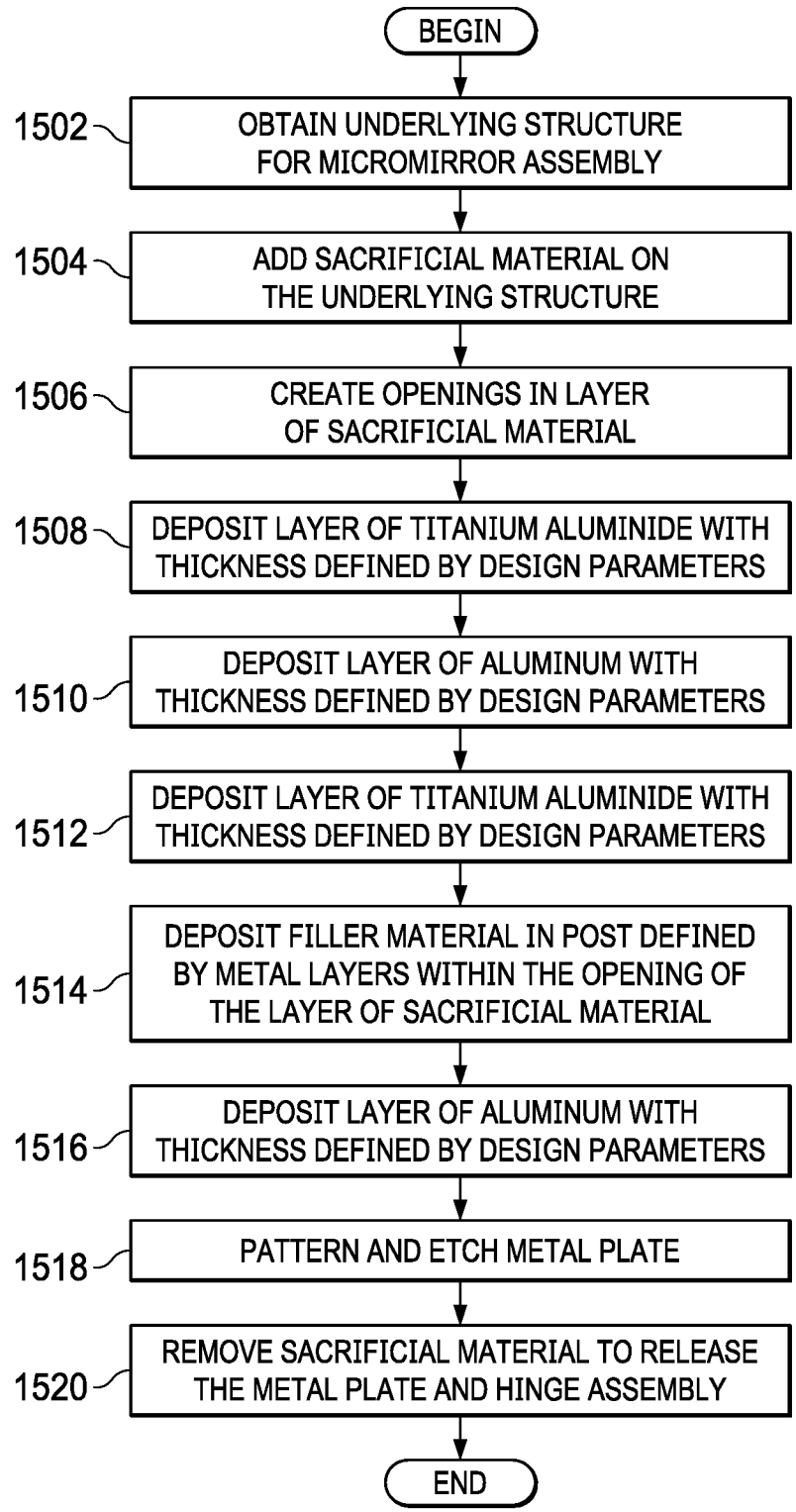
FIG. 15 is a flowchart illustrating an example method of manufacturing a micromirror assembly in accordance with teachings disclosed herein.

FIG. 15 is a flowchart illustrating an example method of manufacturing a micromirror assembly with any one of the micromirror structures 800, 900, 1000, 1100, 1200 of FIGS. 8-12. The example method of manufacture detailed in FIG. 15 will be described with reference to FIG. 16-25, which illustrate an example micromirror assembly at various stages during the fabrication process outlined in the flowchart of FIG. 15. Although the example method of manufacture is described with reference to the flowchart illustrated in FIG. 15 in conjunction with the example stages of fabrication represented in FIGS. 16-25, many other methods may alternatively be used. For example, the order of execution of the blocks may be changed, and/or some of the blocks described may be combined, divided, re-arranged, omitted, eliminated, and/or implemented in any other way. Further, additionally operations not specifically represented by the blocks in FIG. 15 may be included when implementing the example method.

The example process of FIG. 15 assumes that particular design parameters for the different layers in the metal stack that defined the micromirror structure have already been selected. In some examples, the design parameters include the placement or ordering of layers in the metal stack of the micromirror structure as well as the thicknesses of the layers. As discussed above, the particular selection of design parameters enable the particular control of the stress gradient in the plate and, therefore, the particular control of the final shape of the plate. For purposes of explanation it is assumed that the selected ordering of layers is in accordance with the micromirror structure 900 of FIG. 9. Accordingly, the blocks set forth in FIG. 15 are specified to fabricate such a micromirror structure 900. In other examples, the process flow may be suitably adapted to fabricate any other micromirror structure disclosed herein.

Figure 16:
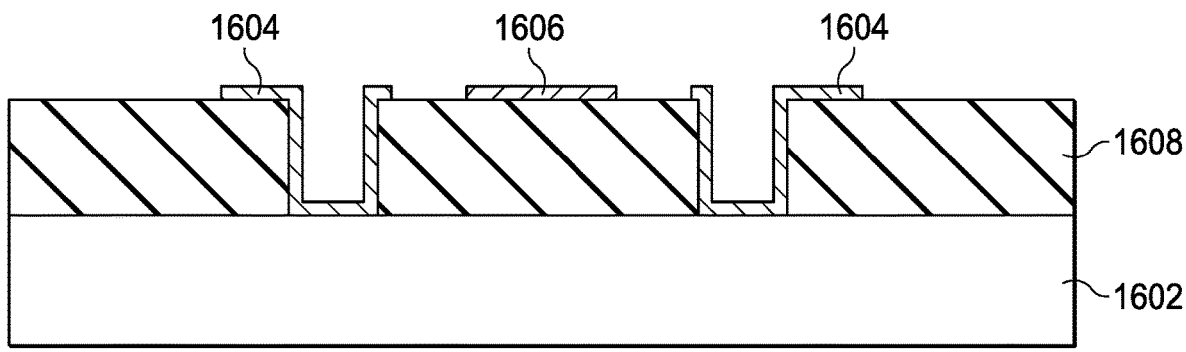
FIGS. 16-25 illustrate different stages of fabrication of the example micromirror assembly described in connection with the example method of manufacture set forth in FIG. 15.

The example process of FIG. 15 begins at block 1502 by obtaining an underlying structure for a micromirror assembly. This stage of fabrication is represented in FIG. 16. In some examples, as shown in FIG. 16, the underlying structure includes a semiconductor substrate 1602 (similar to the substrate 202 of FIG. 2), one or more electrodes 1604 (similar to any one of the electrodes 220, 412, 510 of FIGS. 2-5), and a hinge 1606 (similar to any one of the hinges 214, 408, 508 of FIGS. 205). Further, at this point in the fabrication process, the underlying structure also includes a sacrificial material 1608 that fills in the space surrounding the hinge 1606, the electrodes 1604 and the substrate 1602. The underlying structure for the micromirror assembly can be fabricated using any suitable processes now known or developed in the future. Further, the processes involved can be suitable adapted to fabricate the underlying structure with any suitable design (e.g., corresponding to any one of the micromirror assemblies 104, 400, 500 of FIGS. 2-5).

Figure 17:
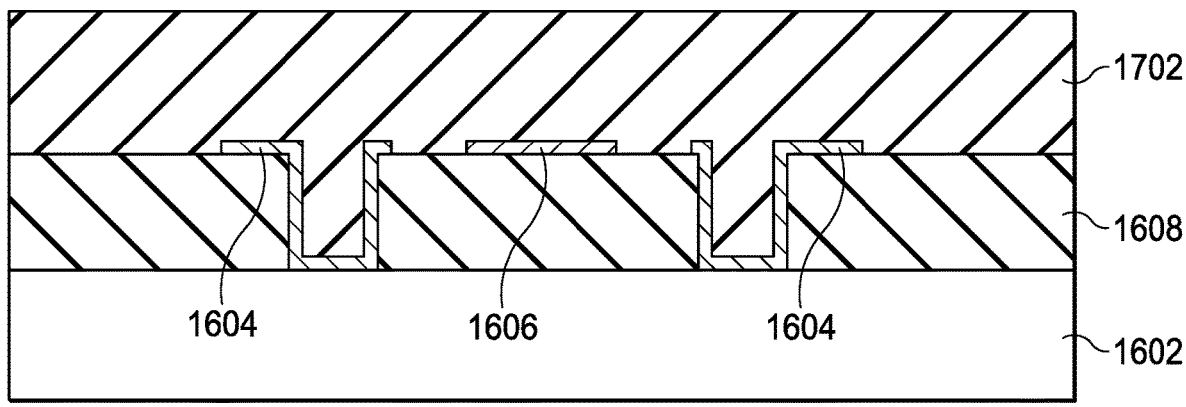

The stage of fabrication corresponding to block 1504 is represented in FIG. 17. Specifically, at block 1504, the method includes adding a sacrificial material 1702 on the underlying structure. More particularly, the sacrificial material 1702 is deposited on the exposed upper surface of the underlying sacrificial material 1608 as well as the exposed upper surface of the hinge 1606 and the exposed surfaces of the electrodes 1604. In this examples, the sacrificial material 1702 fills the hollow interior of the electrodes 1604. The deposition of the sacrificial material 1702 may be accomplished through any suitable process (e.g., atomic-layer deposition (ALD), chemical vapor deposition (CVD), physical vapor deposition (PVD), spin coating, etc.).

Figure 18:
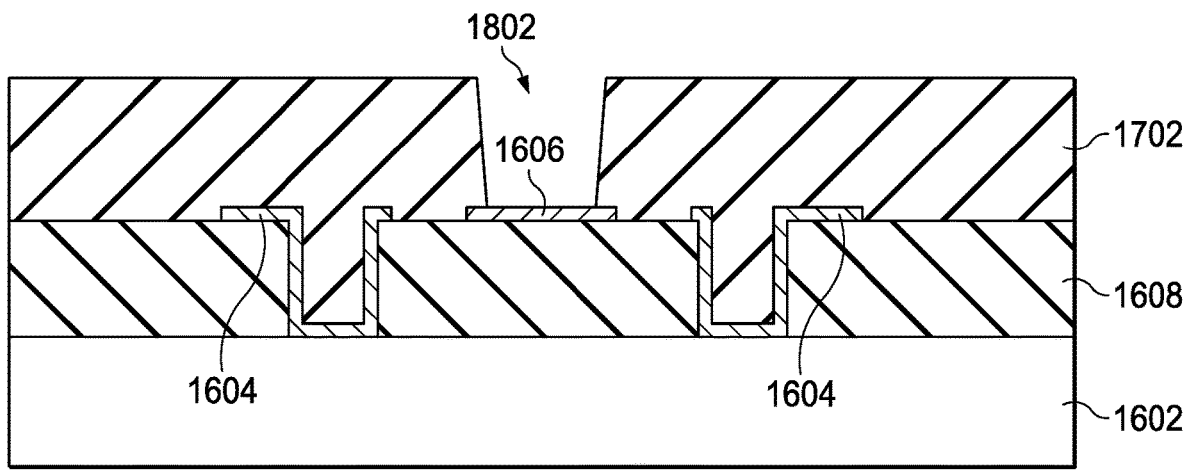

The stage of fabrication corresponding to block 1506 is represented in FIG. 18. Specifically, at block 1506, the method includes creating openings 1802 in the sacrificial material 1702. The openings 1802 may be created using any suitable process (e.g., drilling, etching, photolithography. etc.). In some examples, the openings correspond to locations where the posts to support metal plates of a micromirror structure are to be positioned.

Figure 19:
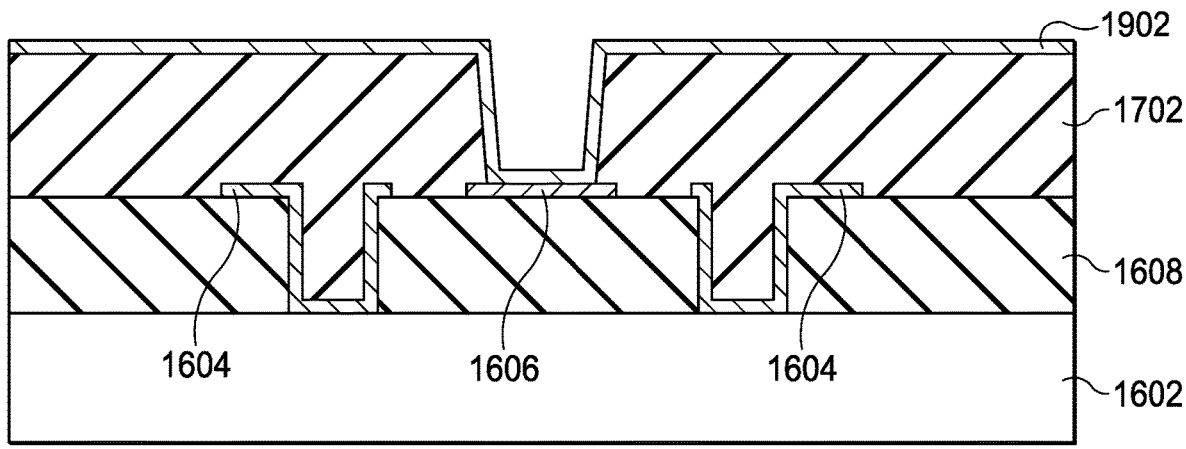

The stage of fabrication corresponding to block 1508 is represented in FIG. 19. Specifically, at block 1508, the method includes depositing a layer 1902 of titanium aluminide with the thickness defined by the design parameters. The deposition of the layer 1902 of titanium aluminide may be accomplished through any suitable process (e.g., atomic-layer deposition (ALD), chemical vapor deposition (CVD), physical vapor deposition (PVD), electroplating, etc.). As shown in the illustrated example of FIG. 19, the layer 1902 of titanium aluminide covers the exposed upper surface of the sacrificial material 1702 and also covers the wall of the opening in the sacrificial material 1702 that is to define the walls for a post. In some examples where the bottom layer of titanium aluminide is to be omitted (as in the example micromirror structure 1000 of FIG. 10), block 1508 is omitted. That is, block 1508 is optional.

Figure 20:
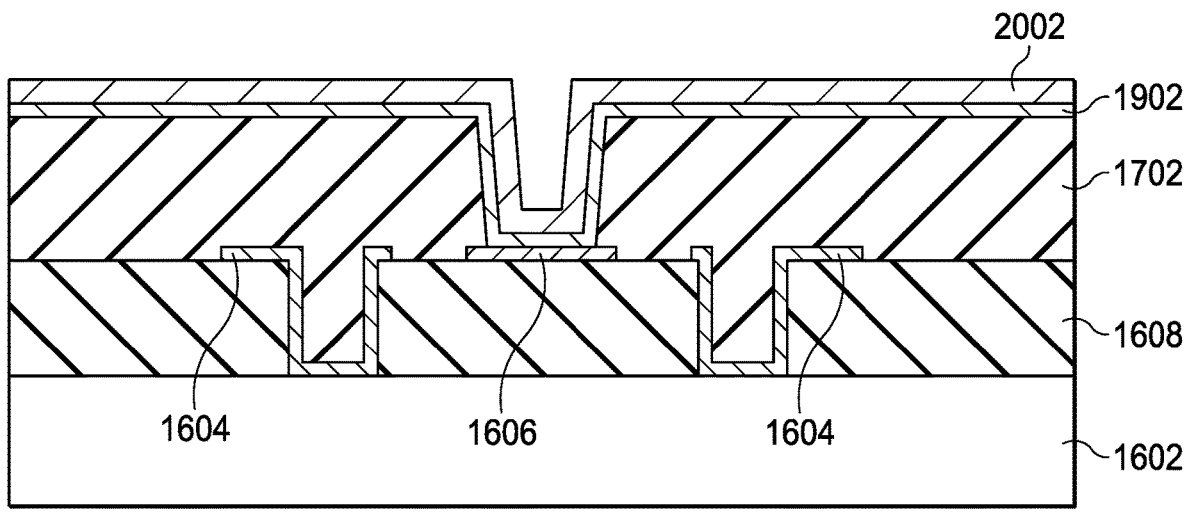

The stage of fabrication corresponding to block 1510 is represented in FIG. 20. Specifically, at block 1510, the method includes depositing a layer 2002 of aluminum with the thickness defined by the design parameters. In this example, the layer 2002 of aluminum is deposited directly onto the previously deposited layer 1902 of titanium aluminide. The deposition of the layer 2002 of aluminum may be accomplished through any suitable process (e.g., atomic-layer deposition (ALD), chemical vapor deposition (CVD), physical vapor deposition (PVD), electroplating, etc.).

Figure 21:
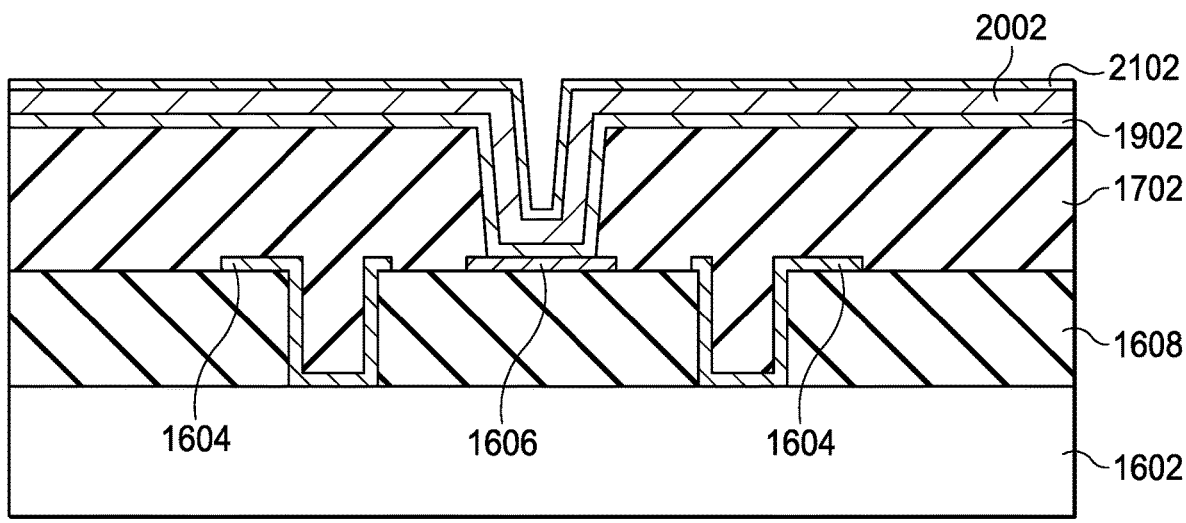

The stage of fabrication corresponding to block 1512 is represented in FIG. 21. Specifically, at block 1512, the method includes depositing a layer 2102 of titanium aluminide with the thickness defined by the design parameters. In this example, the layer 2102 of titanium aluminide is deposited directly onto the previously deposited layer 2002 of aluminum. The deposition of the layer 2102 of titanium aluminide may be accomplished through any suitable process (e.g., atomic-layer deposition (ALD), chemical vapor deposition (CVD), physical vapor deposition (PVD), electroplating, etc.). In some examples where the upper layer of titanium aluminide is to be omitted (as in the example micromirror structure 800 of FIG. 8), block 1512 is omitted. That is, block 1512 is optional. In examples where the upper layer of titanium aluminide is to be deposited on particular regions rather than across the entire underlying surface (as in the example micromirror structure 1200 of FIG. 12), a photoresist may be deposited and patterned before the titanium aluminide is deposited.

Figure 22:
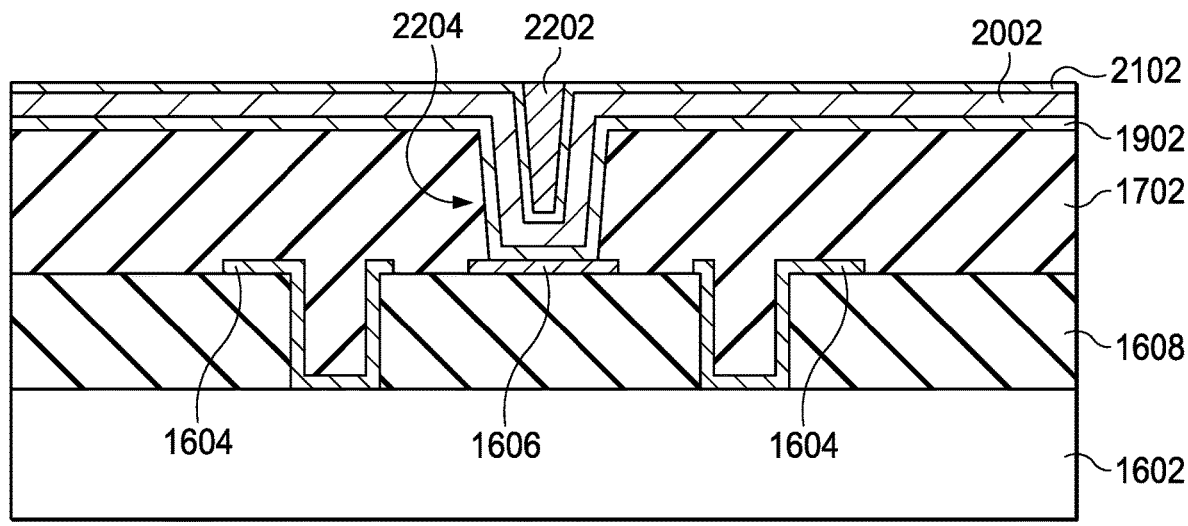

The stage of fabrication corresponding to block 1514 is represented in FIG. 22. Specifically, at block 1514, the method includes depositing a filler material 2202 in the post 2204 defined by the metal layers 1902, 2002, 2102 within the opening of the sacrificial material 1702. The deposition of the layer 2302 of aluminum may be accomplished through any suitable process (e.g., atomic-layer deposition (ALD), chemical vapor deposition (CVD), physical vapor deposition (PVD), etc.). In some examples, after the filler material 2202 is deposited a planarization process may be implemented to make the exposed surface of the filler material 2202 is even with the exposed surface of the metal layer 2102. If the metal layer 2101 is to extend across the top of the filler material 2202 (as in the example micromirror structure 1100 of FIG. 11), block 1514 may be implemented before block 1512. Block 1514 is optional. Accordingly, in some examples, block 1514 is omitted.

Figure 23:
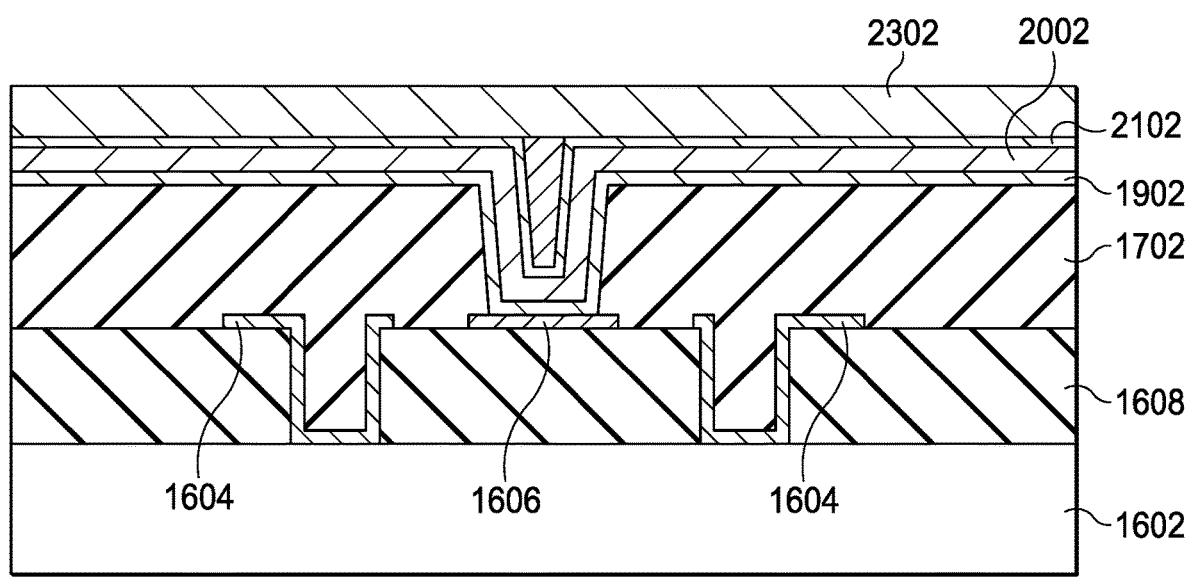

The stage of fabrication corresponding to block 1516 is represented in FIG. 23. Specifically, at block 1516, the method includes depositing a layer 2302 of aluminum with the thickness defined by the design parameters. In this example, the layer 2302 of aluminum is deposited directly onto the previously deposited layer 2102 of titanium aluminide and across the filler material 2202. The deposition of the layer 2302 of aluminum may be accomplished through any suitable process (e.g., atomic-layer deposition (ALD), chemical vapor deposition (CVD), physical vapor deposition (PVD), electroplating, etc.).

Figure 24:
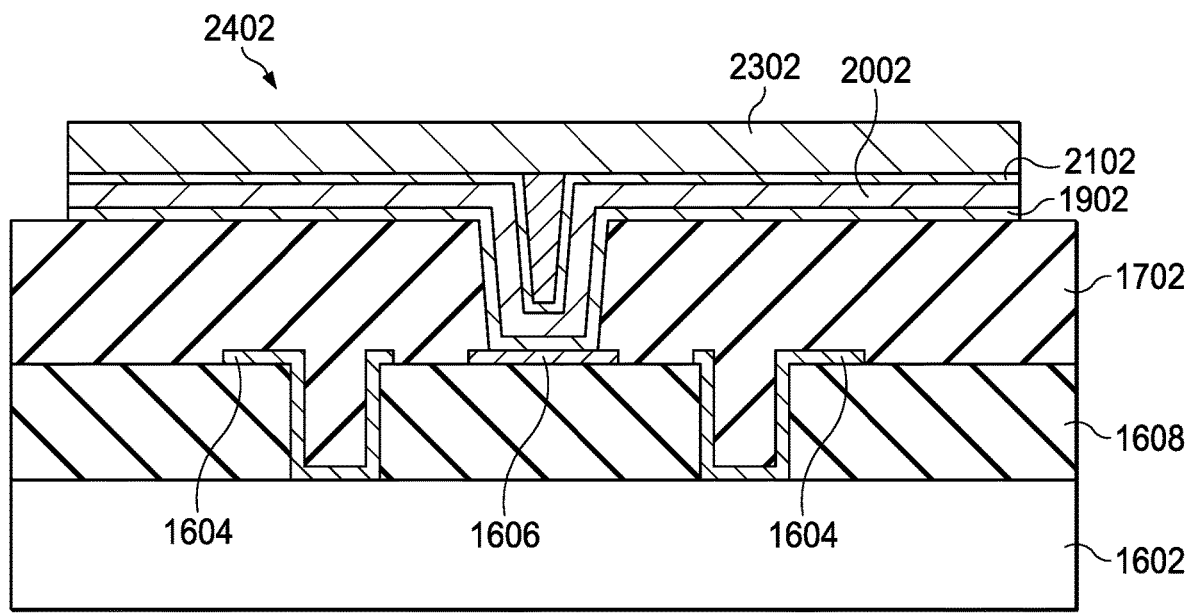
Figure 25:
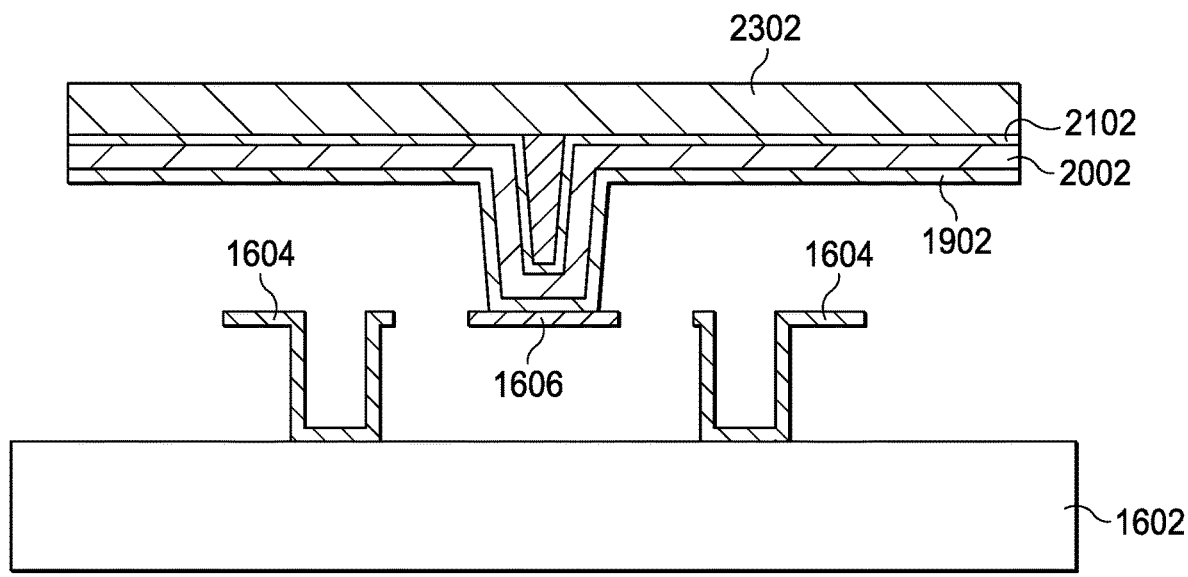

The stage of fabrication corresponding to block 1518 is represented in FIG. 24. Specifically, at block 1518, the method includes patterning and etching the metal plate 2402 for the micromirror assembly. That is, up to this point, the stack of metals correspond to a sheet of metal that is divided (at block 1518) into individual metal plates for individual micromirrors. The patterning and etching may be accomplished through any suitable process (e.g., lithographic techniques).

The stage of fabrication corresponding to block 1520 is represented in FIG. 24. Specifically, at block 1520, the method includes removing the sacrificial materials 1608, 1702 to release the micromirror structure along with the rest of the micromirror assembly. The removal of the sacrificial material may be accomplished using any suitable technique (e.g., a wet etch process). Thereafter, the example method of FIG. 15 ends.

The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that enable the stress gradient in components of MEMS devices to be modified in a controlled manner so as to control the final shape of the components. More particularly, the stress gradient of aluminum components can be precisely controlled by including one or more layers of titanium aluminide in the components and adjusting the thickness of the layers to achieve any suitable final shape for the component. While examples described above and detailed in the figures correspond to mirror surfaces used in micromirror structures of DMDs, teachings disclosed herein are not limited to such applications but can be suitably adapted to control or modify stress gradients in any aluminum-based MEMS structures, components, or elements (e.g., plates, bridges, cantilevers, crab arms, etc.) used in any other type of MEMS devices (e.g., microbolometers, microphones, accelerometers, contact switches, etc.) to control the final shape of such MEMS structures.

Further examples and combinations thereof include the following:

Example 1 includes a microelectromechanical system (MEMS) device comprising a substrate, and a MEMS structure supported by the substrate, the MEMS structure comprising a first layer of a first material comprising a titanium aluminum alloy, and an aluminum layer on the first layer.

Example 2 includes the MEMS device of example 1, wherein the MEMS structure comprises a second layer of a second material, the aluminum layer of the MEMS structure between the first and second layers of the MEMS structure, the second material the same as the first material.

Example 3 includes the MEMS device of example 2, wherein the aluminum layer is a first aluminum layer, the MEMS structure comprises a second aluminum layer, the second layer of the MEMS structure between the first and second aluminum layers of the MEMS structure.

Example 4 includes the MEMS device of example 3, wherein the second aluminum layer of the MEMS structure forms an exterior surface of the MEMS structure.

Example 5 includes the MEMS device of example 1, wherein the aluminum layer is a first aluminum layer, the MEMS structure comprises a second aluminum layer, the first aluminum layer of the MEMS structure between the first layer and the second aluminum layer of the MEMS structure.

Example 6 includes the MEMS device of example 1, further comprising a hinge supported by the substrate, the hinge configured to rotate the MEMS structure, and a post coupling the MEMS structure to the hinge, the first material extending across a top of the post.

Example 7 includes the MEMS device of example 6, further comprising a filler material within the post beneath the first material.

Example 8 includes the MEMS device of example 1, further comprising a hinge supported by the substrate, the hinge configured to rotate the MEMS structure, and a post coupling the MEMS structure to the hinge, the first material extending along a wall of the post.

Example 9 includes the MEMS device of example 1, wherein the first material is titanium aluminide.

Example 10 includes the MEMS device of example 1, wherein the MEMS structure is a mirror, and the MEMS device is a digital micromirror device.

Example 11 includes the MEMS device of example 1, wherein the first layer extends across a first area, and the aluminum layer extends across a second area, the first area corresponding to less than all the second area.

Example 12 includes a microelectromechanical (MEMS) device comprising a substrate, a hinge, a pillar between the hinge and the substrate, and a micromirror coupled to the hinge via a post, the micromirror comprising a first layer of metal, the first layer comprising aluminum, and a second layer of metal below the first layer, the second layer comprising a titanium aluminum alloy.

Example 13 includes the MEMS device of example 12, wherein the micromirror comprises a third layer of metal between the first layer and the second layer, the third layer comprising aluminum.

Example 14 includes the MEMS device of example 13, wherein the micromirror comprises a fourth layer of metal between the first and third layers, the fourth layer comprising a titanium aluminum alloy.

Example 15 includes the MEMS device of example 14, wherein the second layer is thicker than the third layer, and the third layer is thicker than the fourth layer.

Example 16 includes the MEMS device of example 12, wherein the first layer defines a first exposed surface of the micromirror, and the second layer of metal defines a second exposed surface of the micromirror, the first and second exposed surfaces facing in opposite directions.

Example 17 includes the MEMS device of example 12, wherein the micromirror comprises a third layer of metal below the second layer, the third layer comprising aluminum.

Example 18 includes a method comprising obtaining a substrate, depositing a first layer of metal over the substrate, the first layer of metal comprising a titanium aluminum alloy, and depositing a second layer of metal over the first layer of metal, the second layer of metal being an aluminum layer.

Example 19 includes the method of example 18, further comprising depositing a third layer of metal over the second layer of metal, the third layer of metal comprising a titanium aluminum alloy.

Example 20 includes the method of example 18, further comprising depositing a third layer of metal over the second layer of metal, the second layer of metal being an aluminum layer.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A microelectromechanical system (MEMS) device comprising:
    a substrate;
    a post supported by the substrate; and
    a MEMS structure supported by the post, the MEMS structure comprising:
        a first layer of a first material comprising a titanium aluminum alloy; and
        an aluminum layer over the first layer, the aluminum layer over the post.

2. The MEMS device of claim 1, wherein the MEMS structure comprises a second layer of a second material, the aluminum layer of the MEMS structure between the first and second layers of the MEMS structure, the second material the same as the first material.

3. The MEMS device of claim 2, wherein the aluminum layer is a first aluminum layer, the MEMS structure comprises a second aluminum layer, the second layer of the MEMS structure between the first and second aluminum layers of the MEMS structure.

4. The MEMS device of claim 3, wherein the second aluminum layer of the MEMS structure forms an exterior surface of the MEMS structure.

5. The MEMS device of claim 1, wherein the aluminum layer is a first aluminum layer, the MEMS structure comprises a second aluminum layer, the first aluminum layer of the MEMS structure between the first layer and the second aluminum layer of the MEMS structure.

6. The MEMS device of claim 1, further comprising:
    a hinge supported by the substrate, the hinge configured to rotate the MEMS structure; and
    the post coupling the MEMS structure to the hinge, the first material extending across a top of the post.

7. The MEMS device of claim 6, further comprising a filler material within the post beneath the first material.

8. The MEMS device of claim 1, further comprising:
    a hinge supported by the substrate, the hinge configured to rotate the MEMS structure; and
    the post coupling the MEMS structure to the hinge, the first material extending along a wall of the post.

9. The MEMS device of claim 1, wherein the first material is titanium aluminide.

10. The MEMS device of claim 1, wherein the MEMS structure is a mirror, and the MEMS device is a digital micromirror device.

11. The MEMS device of claim 1, wherein the first layer extends across a first area, and the aluminum layer extends across a second area, the first area corresponding to less than all the second area.

12. A microelectromechanical (MEMS) device comprising:
    a substrate;
    a hinge;
    a pillar between the hinge and the substrate; and
    a micromirror coupled to the hinge via a post, the micromirror comprising:
        a first layer of metal, the first layer comprising aluminum; and
        a second layer of metal between the first layer and the hinge, the second layer comprising a titanium aluminum alloy.

13. The MEMS device of claim 12, wherein the micromirror comprises a third layer of metal between the first layer and the second layer, the third layer comprising aluminum.

14. The MEMS device of claim 13, wherein the micromirror comprises a fourth layer of metal between the first and third layers, the fourth layer comprising a titanium aluminum alloy.

15. The MEMS device of claim 14, wherein the second layer is thicker than the third layer, and the third layer is thicker than the fourth layer.

16. The MEMS device of claim 12, wherein the first layer defines a first exposed surface of the micromirror, and the second layer of metal defines a second exposed surface of the micromirror, the first and second exposed surfaces facing in opposite directions.

17. The MEMS device of claim 12, wherein the micromirror comprises a third layer of metal below the second layer, the third layer comprising aluminum.

18. A microelectromechanical system (MEMS) device comprising:
    a substrate;
    a post supported by the substrate; and
    a MEMS structure supported by the post, the MEMS structure comprising:
        a first layer of a first material comprising a titanium aluminum alloy, the first layer forming at least a portion of the post; and
        a second layer over the first layer, the second layer being an aluminum layer.

19. The MEMS device of claim 18, wherein the second layer forms at least a portion of the post.

20. The MEMS device of claim 18, wherein the second layer extends over the post.

* * * * *